United States Patent [19]
Whitmarsh et al.

[11] Patent Number: 5,623,226
[45] Date of Patent: Apr. 22, 1997

[54] AUTOMATIC CALIBRATION OF CARRIER SUPPRESSION AND LOOP PHASE IN A CARTESIAN AMPLIFIER

[75] Inventors: William J. Whitmarsh, Bristol; Simon M. Whittle, Bath, both of United Kingdom

[73] Assignee: Linear Modulation Technology Limited, United Kingdom

[21] Appl. No.: 538,083

[22] Filed: Oct. 2, 1995

[30] Foreign Application Priority Data

Oct. 3, 1994 [GB] United Kingdom ............ 9419915

[51] Int. Cl.$^6$ ................................................. H03F 1/34
[52] U.S. Cl. ................................. 330/2; 330/107
[58] Field of Search .......................... 330/2, 51, 107, 330/109, 149

[56] References Cited

U.S. PATENT DOCUMENTS

| | | | |
|---|---|---|---|
| 4,937,535 | 6/1990 | Underwood et al. | 330/2 X |
| 5,066,923 | 11/1991 | Gailus et al. | 330/107 |
| 5,134,718 | 7/1992 | Gailus | 455/102 |
| 5,365,190 | 11/1994 | Yu et al. | 330/149 |
| 5,381,108 | 1/1995 | Whitmarsh et al. | 330/2 |
| 5,448,203 | 9/1995 | Matui et al. | 330/107 X |

FOREIGN PATENT DOCUMENTS

| | | |
|---|---|---|
| 6-90264 | 3/1994 | Japan. |
| 9224032 | 11/1992 | United Kingdom. |
| 9315985 | 8/1993 | United Kingdom. |
| 2265270 | 9/1993 | United Kingdom. |
| 2272589 | 5/1994 | United Kingdom. |
| WO94/05078 | 3/1994 | WIPO. |

*Primary Examiner*—Steven Mottola
*Attorney, Agent, or Firm*—Harness, Dickey & Pierce, P.L.C.

[57] ABSTRACT

A transmitter comprises an input terminal for receiving a signal to be amplified, a forward amplification path having a power amplifier output stage and a feedback path used to improve linearity, having two modes of operation:

A) during a first mode of operation:
  i) at least occasionally measuring the DC conditions within the transmitter with the power amplifier disabled and using the results to minimize carrier output from the transmitter;
  ii) at least occasionally measuring the phase shift around the feedback loop required to achieve negative feedback;

B) during a second mode of operation, using the measurement of phase shift to ensure negative feedback by applying phase compensation.

16 Claims, 3 Drawing Sheets

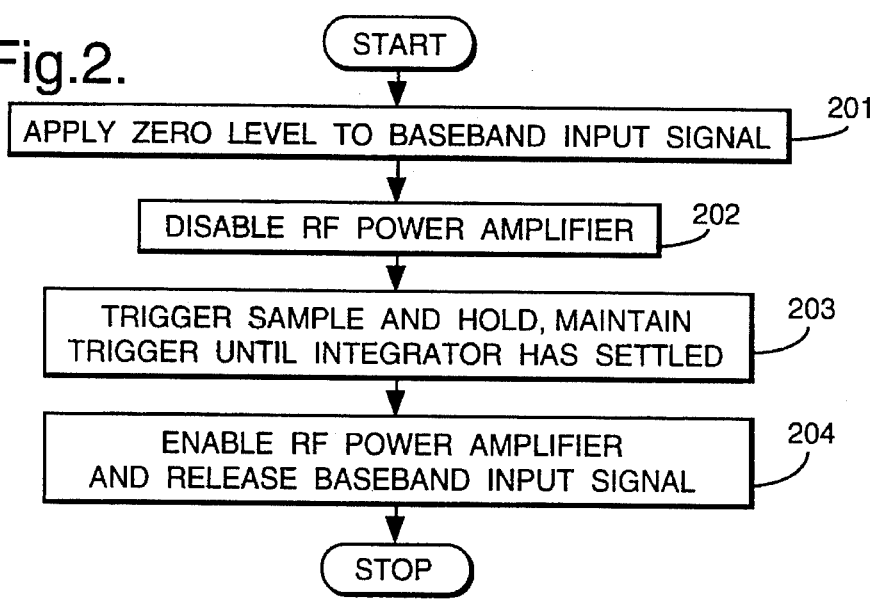
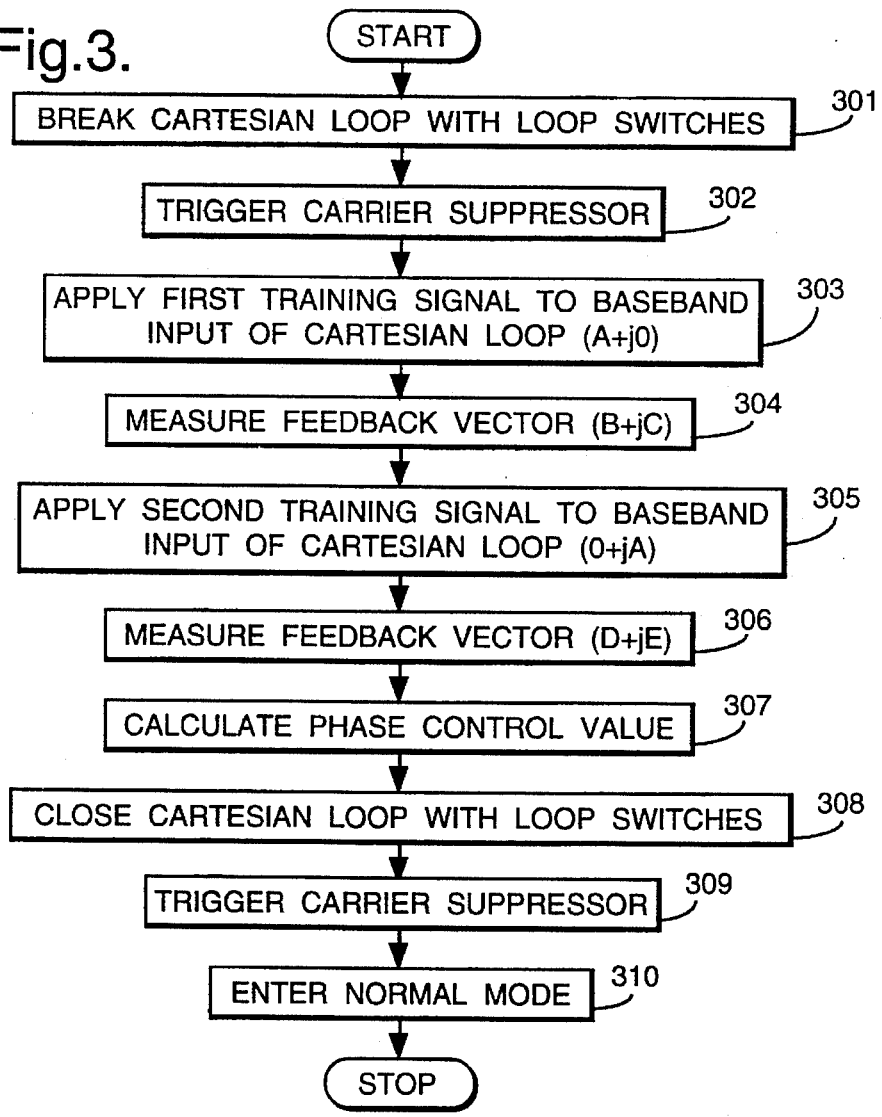

AUTOMATIC CALIBRATION OF CARRIER SUPPRESSION AND LOOP PHASE IN A CARTESIAN AMPLIFIER

The present invention relates to a linear transmitter and concerns the calibration of both carrier suppression and loop phase by applying a training sequence prior to the normal operation of the transmitter. The invention refers particularly to a Cartesian loop transmitter where sufficient carrier suppression is required to prevent interference with the wanted signal. The Cartesian loop uses feedback to linearise an amplifier. Feedback must be applied in a negative sense to prevent instability and this is achieved by measuring the phase shift around the Cartesian loop while the training sequence is applied. During normal operation, a loop phase correction is applied which causes the feedback to act in a negative sense.

The Cartesian loop is known. A description of a linear transmitter based on a Cartesian loop is given in our U.S. Pat. No. 5,381,108, which claimed priority on British Patent Application No. 9315985.3 entitled "Automatic Calibration of the Quadrature Balance within a Cartesian Amplifier". This shows how the loop uses modulation feedback to reduce the unwanted intermodulation products in the RF output. Two problems that afflict Cartesian loop are addressed by this invention.

First, the delay around the loop will cause instability, resulting in unwanted out-of-band radiation, unless a compensation is made to ensure negative feedback. Methods of adjusting the loop phase to compensate for delay and ensure stability are known. Existing methods vary the control of a phase shifter during a training mode of operation until a suitable loop phase setting is achieved. The present invention uses a training sequence to drive the Cartesian loop and measures the correct loop phase. No adjustment is made during the training mode, the correct setting only being applied when the transmitter enters a normal mode of operation.

Second, a Cartesian loop can suffer from poor carrier suppression due to DC offsets in the baseband circuitry. The carrier will appear in the centre of the transmitted channel and if not sufficiently suppressed may degrade the performance of digital or analogue modulation systems. The existence of carrier in the transmission can also cause radiation in adjacent channels when the transmitter is enabled unless power supply ramping is used to prevent a step change in output signal. Correct suppression of the carrier reduces any step change in output and will simplify the design of amplifier power supply switching circuitry.

Thus, a need exists for a method that calibrates a Cartesian amplifier to achieve stable negative feedback while suppressing carrier products in the final output.

The present invention utilises two modes of operation to maintain linearity and carrier suppression within a Cartesian loop, namely a first calibration mode in which the loop is broken for part of the time and closed for part of the time and a second, normal mode during which the loop is always closed. During calibration mode, the loop is broken and DC offsets in the forward path are measured and minimised using a sample and hold circuit. This suppresses carrier components in the output. The necessary loop phase adjustment is then measured by applying at least two training signals to the input of the transmitter and deriving a result from at least two feedback signals obtained at the output of the down-converter. Finally, the loop is closed with the final amplifier stage disabled and the relevant loop phase setting applied. DC offsets are minimised in the baseband components of the loop using a sample and hold and the amplifier is enabled. In this way, carrier components in the final output are minimised. The system is then switched to normal mode and the wanted modulating signal is applied to the input of the transmitter.

According to the present invention, there is provided a transmitter comprising an input terminal for receiving a signal to be amplified, a forward amplification path having a power amplifier output stage and a feedback path used to improve linearity, having two modes of operation, namely a first calibration mode in which the transmitter is conditioned for operation in a second transmission mode in which the transmitter is used for transmission of signals applied to the input, the transmitter being arranged to operate in the first and second modes as follows:

A) during the first mode of operation:

i) the DC conditions within the transmitter are measured with the output of the power amplifier stage disabled and the results are used to minimise carrier output from the transmitter;

ii) the phase shift around the feedback loop required to achieve negative feedback is measured;

B) during the second mode of operation, the measurement of phase shift is used to ensure negative feedback by applying phase compensation.

The invention also provides a linear transmitter implemented using a Cartesian loop, having two modes of operation, namely a first calibration mode in which the transmitter is conditioned for operation in a second transmission mode in which the transmitter is used for transmission of signals applied to the input, the transmitter being arranged to operate in the first and second modes as follows:

A) during the first calibration mode:

i) the DC conditions within the transmitter with the output stage of the power amplifier disabled are measured and the results are used to minimise carrier output from the transmitter;

ii) the phase shift around the feedback loop required to achieve negative feedback is measured;

B) during the second transmission mode, the measurement of phase shift is used to ensure negative feedback by applying phase compensation.

The invention also provides a transmitter for use in a time domain multiplexed system comprising an input terminal for receiving a signal to be amplified, a forward amplification path having a power amplifier output stage and a feedback path used to improve linearity of the transmitter, the transmitter having two modes of operation, namely a first calibration mode in which the transmitter is conditioned for operation in a second transmission mode in which the transmitter is used for transmission of signals applied to the input, the transmitter being arranged to operate in the first and second modes as follows:

A) during the first mode of operation the DC conditions within the transmitter with the power amplifier output stage disabled are measured and the results are used to minimise carrier output from the transmitter;

B) during the second mode of operation, transmitting a wanted modulation signal.

The invention will be further described by way of non-limitative example with reference to the accompanying drawings, in which:

FIG. 2 is a flowchart illustrating the operation of the carrier suppressor shown in FIG. 1;

FIG. 3 is a flow chart illustrating the operation of the loop phase calculator shown in FIG. 1;

Figure 1:
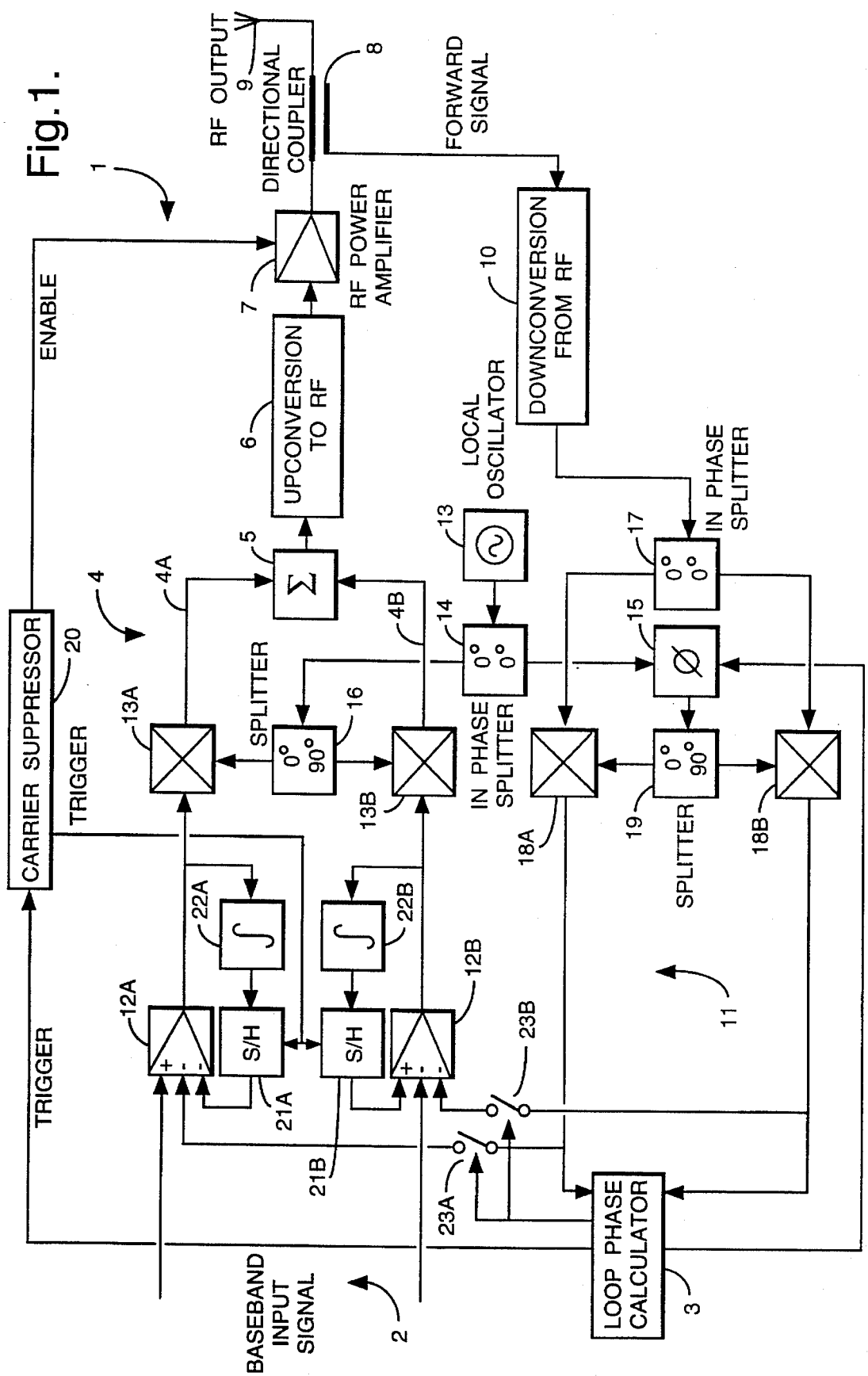
FIG. 1 illustrates in block form an embodiment of a Cartesian loop transmitter according to the present invention.

FIG. 1 illustrates, block diagram form, a Cartesian loop transmitter 1 embodying the present invention. In normal mode, a baseband input signal 2 is applied to the transmitter input terminal in the form of a quadrature ("real" and "imaginary") signal. When the transmitter is active, it is important that negative feedback exists within the Cartesian loop. This is achieved by the loop phase calculator 3, which controls other components of the transmitter to establish operation in the first or second mode; when in the first mode it calculates the required phase change to achieve stability and then applies a suitable control to the loop.

The loop phase calculator 3 may be programmed to initiate operation in the first, training, mode, inter alia in the following circumstances:

a) at the start of operation of the transmitter;

b) at periodic intervals between operation in the second, normal mode;

c) when a relevant operating parameter of the transmitter is changed e.g. transmission frequency;

d) in response to an external command e.g. from a manually operated switch or from training-mode-initiate commands received via an associated receiver from a system with which the transmitter is communicating; and e) any combination of a)-d).

It is expected that a minimally functional implementation of the invention would initiate training-mode operation in circumstances a) and b).

The baseband input signal 2 is applied to respective forward paths 4A, 4B of a quadrature up-converter 4 which results in signals at a suitable intermediate frequency. The output paths 4A and 4B are summed by the combiner 5 and then subjected to optional up-conversion to RF by the modulator 6. The conversion to RF may be direct, in which case modulator 6 would not be present. The form of the RF signal is not directly relevant to the present invention, but it is noted that the embodiment of FIG. 1 was devised for production of a single sideband, suppressed carrier mobile radio signal.

The signal resulting from the up-conversion is applied as the input to an RF amplifier 7. The purpose of the Cartesian loop is to linearise the amplification of a signal between the baseband input to quadrature up-converter 4 and the output of this power amplifier 7.

The output of the amplifier 7 is applied via a directional coupler 8 to the RF output 9 for transmission. The directional coupler 8, provides a sample of the output which is used to drive the feedback part of the Cartesian loop.

The sampled signal is down-converted back to IF by an optional frequency down-converter 10 which would not be present in a direct conversion system. The resulting signal is then processed, by quadrature down-converter 11, so as to resolve it into two quadrature baseband feedback signals which are used to apply respective corrections to the signals passing through the two parallel forward paths 4A, 4B. As with the frequency up-conversion, the frequency down-conversion may be direct from RF to baseband or via one or more stages of intermediate frequency conversion. The demodulation should, needless to say, be the inverse of the modulation applied in the up-conversion.

The two forward paths 4A, 4B include, as a first stage, differential amplifiers 12A and 12B which respectively receive the real and imaginary quadrature components of the baseband input signal 2 and the corresponding quadrature component from the feedback path 11 and produces an output equal to the difference between those components.

The difference signals for the real and imaginary components from the amplifiers 12A, 12B are applied to respective mixers 13A, 13B where they are mixed with signals derived from the output of a local oscillator 13.

The output of oscillator 13 passes through power splitter 14 which divides the signal between the forward and reverse paths of the Cartesian loop. In the reverse path, a phase shifter 15 provides compensation for delays around the Cartesian loop so that negative feedback at the error amplifier is ensured. The output from the power splitter 14 passes through a 0°/90° phase shifter/splitter 16 so that the signals from amplifiers 12A and 12B are mixed with two sinusoidal signals from the output of oscillator 13 which are 90° phase shifted relative to one another. This achieves a quadrature up-conversion of the output of amplifiers 12A and 12B.

In the feedback path, the output of the frequency down-converter 10 is applied to the input of a 0°/0° phase splitter 17. The outputs from phase splitter 17 are applied to two mixers 18A, 18B where they are mixed with two signals, phase shifted 90° relative to one another derived by splitter 19, phase shifter 15 and splitter 14 from the local oscillator 13. The outputs of the mixers 18A, 18B are applied to the inverting inputs of amplifiers 12A, 12B, as representing quadrature components at baseband of the output of amplifier 7.

During calibration mode, the loop phase calculator 3 derives a value of phase shift for the phase shifter 15 to utilise during normal operation. During this process carrier suppression is triggered, typically on two occasions, which causes the carrier suppressor 20 to remove DC components from the drive to mixers 13A, 13B. The carrier suppressor 20 achieves this by first disabling the RF power amplifier 7 so that there is no power incident on the directional coupler 8. Zero DC is applied at the baseband input 2. The sample and hold circuits 21A, 21B on the two quadrature arms of the up-converter are then triggered. The sample and hold circuits are configured such that they will act as an amplifier so long as the trigger line is held true. Thus carrier suppressor 20 will hold the sample and hold trigger at a true level for sufficient time for integrators 22A and 22B to remove any DC component from the output of differential amplifiers 12A, 12B. The trigger line to the sample and hold is then taken false and the sample and hold circuit will store the final level of the integrator output. This causes no DC to be applied to the mixers 13A and 13B so long as no DC is applied at the baseband input 2.

The loop phase calculator 3 measures the required phase shift for loop stability as follows: First the loop is broken by opening switches 23A, 23B. A constant level (A) is applied to one path (I) of the baseband input signal 2. The feedback signal from the down-converter 11 is measured. Then a constant level (A) is applied to the other path (Q) of the baseband input signal 2 (with a zero level on I) and again the signal from the down-converter is measured, From the two feedback vectors, the phase calculator 3 can derive the required phase shift setting without the need to measure the carrier contribution to each feedback vector. This process is described in more detail below.

FIG. 2 is a flowchart for one implementation of the carrier suppressor 20. This function can be triggered by the loop phase calculator 3 at the relevant time. It begins by removing all signal from the baseband input 201. A reference DC level then exists at the baseband input due to offsets in any drive circuitry. The carrier suppressor will remove any carrier at the output of the Cartesian loop which is due to such fixed offsets in the drive to the baseband input. The carrier suppressor then disables the RF power amplifier 202. Thus no signal is applied to the directional coupler, from which no signal is applied to the feedback path of the Cartesian loop. The carrier suppressor then applies a true level to the sample and holds 203 for long enough for the integrators 22A, 22B to remove all DC from the drive to the mixers 13A, 13B. The trigger to the sample and hold is then set false so that the correct carrier suppression level is held. Finally, the RF power amplifier is enabled and the baseband drive signal released 204.

FIG. 3 is a flow chart for one implementation of the loop phase calculator 3. It begins by breaking the Cartesian loop 301 using the loop switches 23A, 23B. With the loop broken, the carrier output can be minimised using the carrier suppressor. This is triggered by the loop phase calculator 302. A first training sequence is then applied to the baseband signal 303 and the feedback vector from the down-converter is measured 304. A second training sequence is applied 305 and a second feedback vector is measured 306. From the results, a phase setting for the phase shifter 14 is calculated 307. The loop is closed using the loop switches 308 and the carrier suppressor is again triggered so that the carrier output is minimised in closed loop mode 309. Finally, the Cartesian loop is able to enter normal mode for the transmission of wanted modulation 310.

Figure 4:
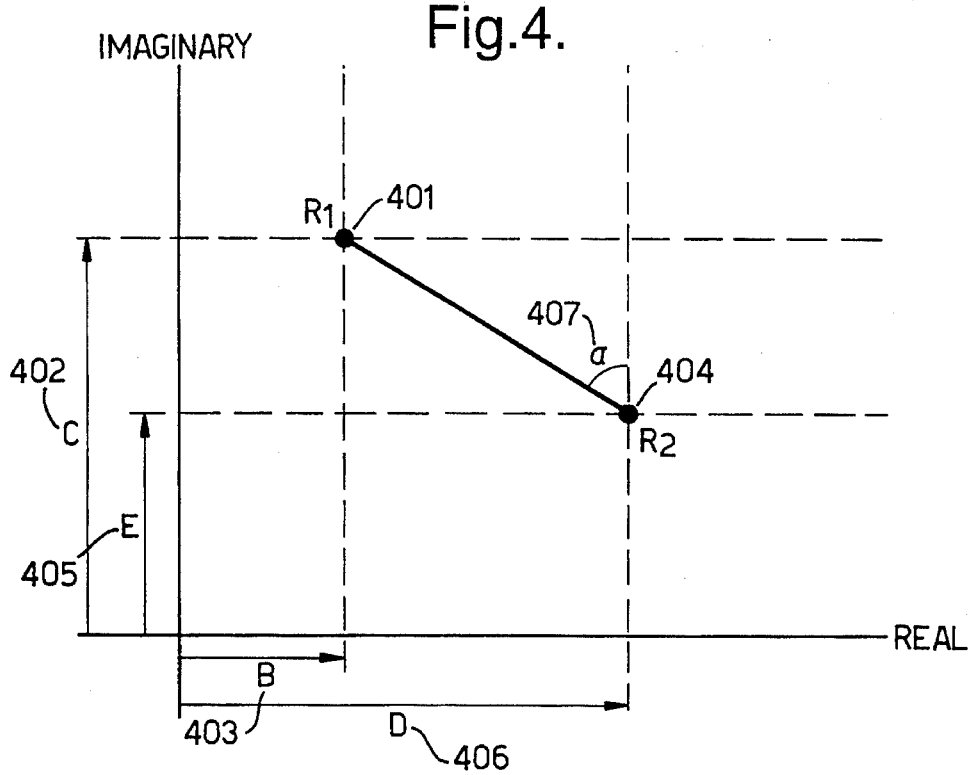
FIG. 4 is an Argand diagram illustrating measurements made in the embodiment of the invention of FIG. 1.

A preferred method of calculating the phase setting for the phase shifter 15 proceeds according to the following algorithm using FIG. 4 to show the relationship between feedback vectors.

A first input vector is applied to the input of the Cartesian loop. This applies a fixed signal (A) to the I input while applying zero DC to the Q input. Thus the first vector can be presented by (A+j0). The resultant feedback vector $R_1$ (401) consists of a real term B (402) and an imaginary term C (403). Thus the first feedback vector can be represented by (B+jC). A second input vector in applied to the input of the Cartesian loop in the form (0+jA). This results in a second feedback vector $R_2$ (404) with a real component D (405) and an imaginary component (E) (406) giving a form (D+jE). The difference between vectors $R_1$ and $R_2$ gives rise to an angle α (407) from which the required phase shift θ that needs to be applied to the phase shifter 15 can be derived using the relationship:

$$\theta = \alpha - 45°$$

The angle α can be calculated as follows:

$$\alpha = \tan^{-1}((D-B)/(C-E)) \text{ if } (C-E) > 0$$

$$\alpha = 180° + \tan^{-1}((D-B)/(C-E)) \text{ if } (C-E) < 0$$

If $(C-E)=0$ and $(D-B)>0$ then $\alpha=90°$

If $(C-E)=0$ and $(D-B)<0$ then $\alpha=270°$

Finally:
If from the above calculations α<45° then α=α+360° A value for the required phase shift θ can thus be derived. This is applied to the phase shifter 15 after the training process is complete.

Figure 5:
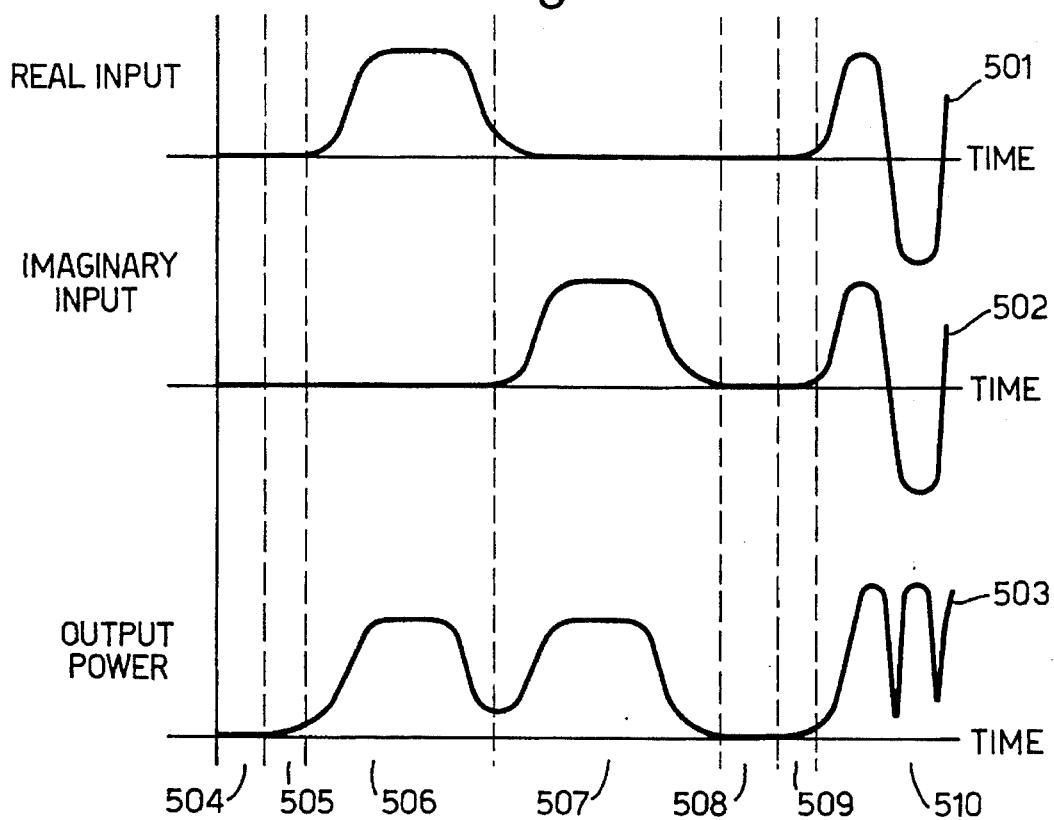
FIG. 5 illustrates quadrature input waveforms and the resultant output waveform in operation of the embodiment of FIG. 1.

FIG. 5 shows the signal applied to the baseband input signal during the training process. This is divided into a real component 501 and an imaginary component 502. The resulting output power from the transmitter is also shown 503.

Initially a zero level is applied to the baseband input signal 504: during this time the carrier suppressor will reduce any unwanted DC offset that is fed to the forward channel mixer while the Cartesian loop is broken. The RF power amplifier is then enabled and a short period 505 is associated with ramping the power supply to the RF power amplifier to limit the transient so that out of band splatter is minimised. The transient is of a much reduced level due to the removal of DC during the carrier suppression stage 504. The first training sequence is then applied to the baseband input signal 406. This applies a DC level to the real input while applying a zero level to the imaginary input. The DC level is filtered to prevent out of band radiation. During this interval, the first feedback vector is measured. The second training sequence is then applied to the baseband input signal 507. A second feedback vector is measured.

At this point the Cartesian loop is closed with the RF power amplifier disabled and the carrier suppressor is again triggered 508 so that carrier is minimised with the loop closed. Before the RF power amplifier is enabled again, the required loop phase setting is fed to the local oscillator phase shifter 15. After the RF power amplifier has ramped to full power 509, the wanted modulation can be applied 510.

Typically, the modulation is at a higher level than the first and second training signals. When the modulation is applied the Cartesian loop is closed and the gain is set primarily by the down-converter. When the training signals are applied, the Cartesian loop is open and the gain is set primarily by the up-converter. Thus the transmitter exhibits different gains under the two conditions.

The carrier suppressor mechanism is able to reduce carrier components in the output of the transmitter to greater than 50 dB below the rated peak envelope power of the amplifier. Thus the need to reduce the power-up transient is much reduced and can be achieved more quickly. In addition, any interference of the carrier with wanted modulation on the channel is greatly reduced.

The transmitter of the present invention was developed primarily for RF transmission in trunked radio systems using FDM/FDMA (Frequency Division Multiplexing or Frequency Division Multiple Access); however it is also applicable to TDM/TDMA (Time Division Multiplexing or Time Division Multiple Access).

In a TDM or TDMA system, a number of input voice or data signals are cyclically sampled and division multiplexed into successive slots of a TDM signal which is then up-converted to RF and may be transmitted using an amplifier embodying the invention.

In a first transmission will be separated in time from subsequent transmissions. As there is no transmission during the intervening periods, the transmitter must be enabled at the beginning of each TDM/TDMA slot during which it is active. To minimise splatter into adjacent channels in a system using a Cartesian loop transmitter, the carrier suppressor can be triggered at the beginning of each slot prior to transmission of wanted modulation or at any time when the system is not transmitting (this being the case when the invention is applied to FDM/FDMA systems). Alternatively, the carrier suppressor could be triggered at the beginning of selected slots and the DC conditions stored between each occurrence of the trigger.

The main advantage of the use of the carrier suppressor in a TDM/TDMA system is that other methods of reducing power-up transients on the RF power amplifier can be simplified because the transient would be much smaller.

We claim:

1. A transmitter comprising an input terminal for receiving a signal to be amplified, a forward amplification path having a power amplifier output stage and a feedback path used to improve linearity, having two modes of operation, namely a first calibration mode in which the transmitter is conditioned for operation in a second transmission mode in which the transmitter is used for transmission of signals applied to the input, the transmitter being arranged to operate in the first and second modes as follows:

A) during the first mode of operation:
  i) the DC conditions within the transmitter are measured with the output of the power amplifier stage disabled and the results are used to minimize carrier output from the transmitter;
  ii) the phase shift around the feedback loop required to achieve negative feedback is measured;
B) during the second mode of operation, the measurement of phase shift is used to ensure negative feedback by applying phase compensation.

2. A transmitter according to claim 1 wherein the phase shift around the loop is measured while the equipment is operated open loop.

3. A transmitter according to claim 1 and comprising an integrator and sample and hold circuits, wherein the DC conditions are measured using the integrator, the integrator supplying DC levels which are set in the sample and hold circuits and applied to the real and imaginary components of baseband signal within the feedback loop during operation in the second mode.

4. A transmitter according to claim 1 and including means for carrying out the measurement of DC conditions at least occasionally while the transmitter is operating open loop and at least occasionally while the transmitter is operating closed loop.

5. A transmitter according to claim 1 wherein the phase shift around the feedback loop is measured without the need to directly determine the contribution of the transmitted carrier to the measurement.

6. A linear transmitter implemented using a Cartesian loop, having two modes of operation, namely a first calibration mode in which the transmitter is conditioned for operation in a second transmission mode in which the transmitter is used for transmission of signals applied to the input, the transmitter being arranged to operate in the first and second modes as follows:

A) during the first calibration mode:
  i) the DC conditions within the transmitter with the output stage of the power amplifier disabled are measured and the results are used to minimize carrier output from the transmitter;
  ii) the phase shift around the feedback loop required to achieve negative feedback is measured;
B) during the second transmission mode, the measurement of phase shift is used to ensure negative feedback by applying phase compensation.

7. A linear transmitter according to claim 6 wherein the phase shift around the loop is measured while the equipment is operated open loop.

8. A linear transmitter according to claim 6 and comprising an integrator and sample and hold circuits, the integrator being operative to measure the DC conditions, the integrator supplying DC levels which are set in the sample and hold and applied to the real and imaginary components of baseband signals within the feedback loop.

9. A linear transmitter according to claim 6 wherein the measurement of DC conditions occurs at least occasionally while the transmitter is operating open loop and a least occasionally while the transmitter is operating closed loop.

10. A linear transmitter according to claim 6 wherein the phase shift around the feedback loop is measured without the need to directly determine the contribution of the transmitted carrier to the measurement.

11. A transmitter according to claim 1 and arranged for use in a frequency division multiplexed communication system.

12. A transmitter according to claim 1 and arranged for use in a time domain multiplexed system.

13. A transmitter according to claim 12, wherein means are provided to make the measurement of DC conditions at intervals of several TDM slots and to store the values until the next measurement.

14. A transmitter for use in a frequency division multiplexed system comprising an input terminal for receiving a signal to be amplified, a forward amplification path having a power amplifier output stage and a feedback path used to improve linearity of the transmitter, the transmitter having two modes of operation, namely a first calibration mode in which the transmitter is conditioned for operation in a second transmission mode in which the transmitter is used for transmission of signals applied to the input, the transmitter being arranged to operate in the first and second modes as follows:

A) during the first mode of operation the DC conditions within the transmitter with the power amplifier output stage disabled are measured and the results are used to minimize carrier output from the transmitter;
B) during the second mode of operation, transmitting a wanted modulation signal.

15. A transmitter according to claim 14 and comprising an integrator and sample and hold circuits wherein the DC conditions are measured using the integrator, the integrator supplying DC levels which are set in the sample and hold circuits and applied to the real and imaginary components of baseband signal within the feedback loop during operation in the second mode.

16. A transmitter according to claim 14 and including means for carrying out the measurement of DC conditions at least occasionally while the transmitter is operating open loop and at least occasionally while the transmitter is operating closed loop.

* * * * *